United States Patent [19]

Ko et al.

[11] 4,011,449
[45] Mar. 8, 1977

[54] APPARATUS FOR MEASURING THE BEAM CURRENT OF CHARGED PARTICLE BEAM

[75] Inventors: Wen-Chuang Ko, Wappingers Falls, N.Y.; Erich Sawatzky, San Jose, Calif.

[73] Assignee: IBM Corporation, Armonk, N.Y.

[22] Filed: Nov. 5, 1975

[21] Appl. No.: 629,181

[52] U.S. Cl. .......................... 250/309; 250/492 A
[51] Int. Cl.² ................. H01J 37/00; G01N 23/00
[58] Field of Search ............. 250/492 A, 310, 397, 250/300, 309

[56] References Cited

UNITED STATES PATENTS

| 3,117,022 | 1/1974 | Bronson et al. | 250/492 A |
| 3,535,516 | 10/1970 | Munakata | 250/310 |
| 3,689,766 | 9/1972 | Freeman | 250/492 A |
| 3,778,626 | 12/1973 | Robertson | 250/492 A |

OTHER PUBLICATIONS

"A Simple Source for Implantation Doping of Semiconductors" Gwozdz et al., Rev. of Sci. Inst., vol. 41, No. 11, Nov. 1970, pp. 1667–1678.

*Primary Examiner*—Alfred E. Smith
*Assistant Examiner*—B. C. Anderson
*Attorney, Agent, or Firm*—J. B. Kraft

[57] ABSTRACT

In an ion implantation apparatus, a structure for measuring the beam current at the target wherein a Faraday Cage is formed by walls adjacent to and electrically insulated from the target in combination with the target, means for biasing the target at a negative potential, means for biasing the walls at ground potential and means for measuring the target current and the wall current and for combining the two to provide an accurate beam current measurement.

18 Claims, 5 Drawing Figures

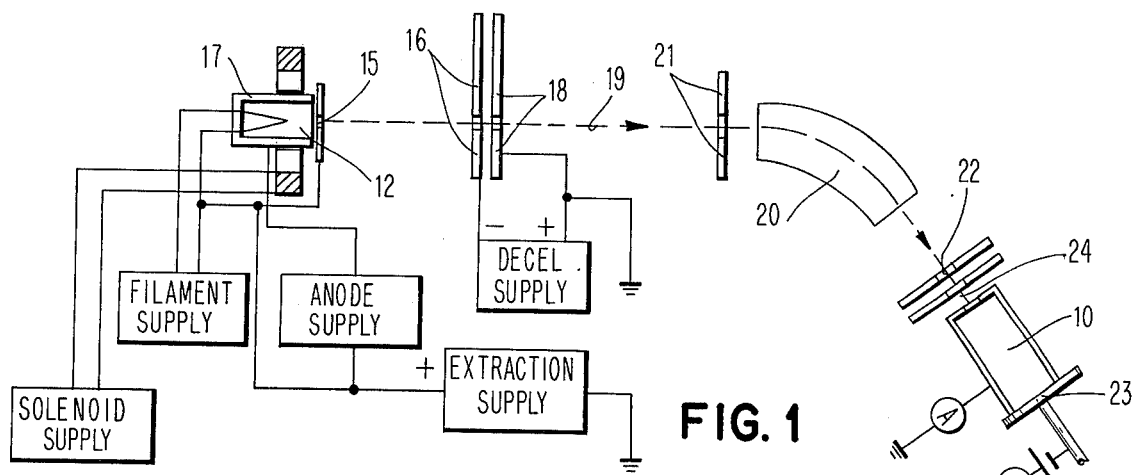
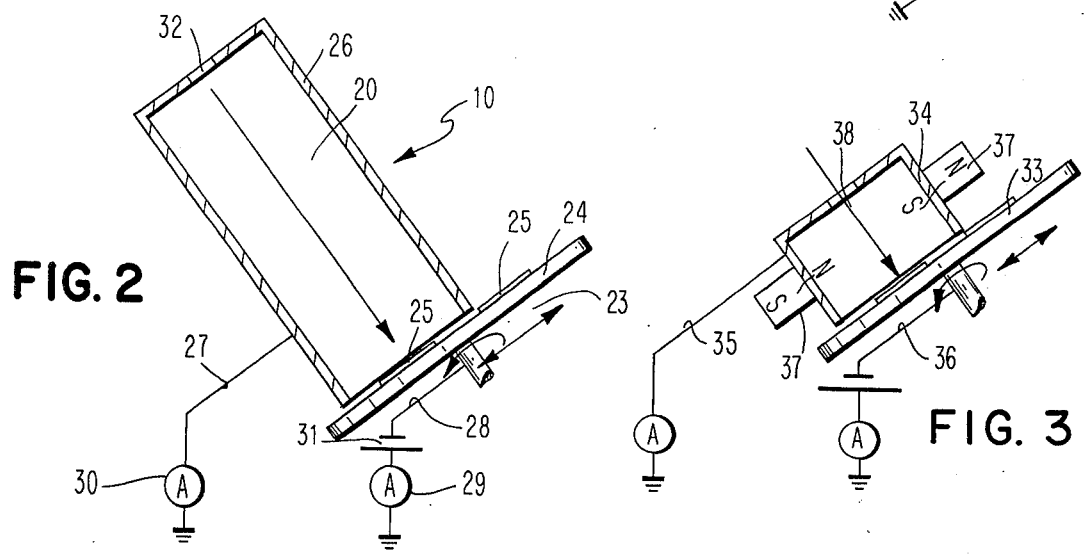
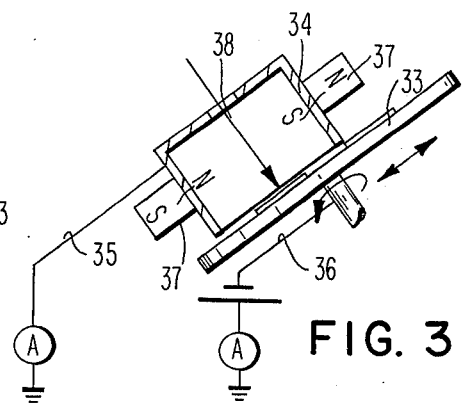
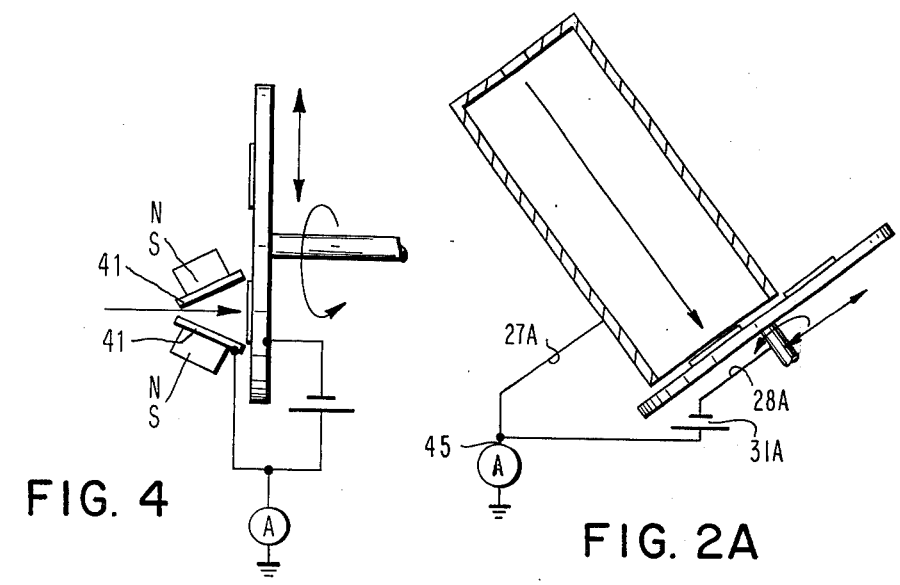

APPARATUS FOR MEASURING THE BEAM CURRENT OF CHARGED PARTICLE BEAM

BACKGROUND OF THE INVENTION

The present invention relates to apparatus for measuring the beam current of beams of charged particles, particularly ion beams or electron beams. Reliable ion beam current measurements and electron beam current measurements are respectively necessary in ion implantation systems and in electron beam bombardment systems since the implanted dose or the extent of the electron bombardment is directly related to the beam current. Beam current measurements are complicated by the fact that energetic ions or electrons impinging on a solid surface eject secondary electrons and ions. Any surface such as the beam-defining apertures or the implantation target and its mounting hardware can be sources of such secondary electrons or ions. Due to the presence of such secondary particles, conventional measuring systems will not provide an accurate representation of the true beam current since any secondary particles arriving at or leaving the target will affect the target current.

Monitoring of ion implantation currents or dosages with Faraday Cages is known in the art. The text, "Ion Beams With Applications to Ion Implantation", R. G. Wilson and G. R. Brewer (1973, pp. 446 – 449, 451 – 452, and 457) discusses the conventional utilization of the Faraday Cage for ion beam current or dosage monitoring. In such monitoring, the cage may be a separate unit retractably inserted between the target and the beam for occasional monitoring, or the Faraday Cage may consist of the actual target in combination with the housing walls for continuous monitoring during the ion implantation operation. In either case, the actual target or the target plate (in the case of the retractable cage) is fully insulated from the cage walls. In such conventional Faraday Cage monitoring in the case of the primary ion beams which are always positively charged, the target is conventionally maintained at a potential which is positive with respect to the cage walls maintained at a negative voltage level. In such a structure, the cage walls purportedly function to suppress secondary electrons created at the target back toward the target so that the loss of such electrons will not affect the target current which is the only current measured by an ammeter and similar measuring apparatus in determining current or dosage. However, we have found that such conventional Faraday Cages appear to not take into account the secondary ions which are also created at the target. The negative potential of Faraday Cage walls will attract such ions and will thereby produce an adverse effect on the beam current measured only from the target.

Furthermore, the negative bias on the cage walls should cause some undesirable ion beam expansion beyond the desired limits of the beam or the limits of the beam target.

SUMMARY OF THE PRESENT INVENTION

Accordingly, it is an object of the present invention to provide apparatus for accurately measuring the beam current of a beam of charged particles.

It is a further object of the present invention to provide an apparatus for measuring the beam current of a beam of charged particles wherein the effect of secondary emissions of secondary charged particles is taken into account in said determination.

It is yet a further object of the present invention to provide apparatus for measuring the beam current of an ion beam at the beam target wherein the effect of secondary electrons and ions is taken into account in making said determination.

In accordance with the present invention, there is provided a structure for measuring the beam current at the target of a beam of charged particles, e.g., an ion beam or an electron beam, which comprises a Faraday Cage formed by a combination of walls adjacent to and electrically insulated from the target surrounding the beam in combination with the target itself. Means are provided for biasing the target at a potential opposite the polarity of the primary particles in the beam, e.g., with an ion beam where the primary particles are positive ions the target is biased at a negative potential, and with an electron beam apparatus where electrons, the primary particles, have a negative charge, the target is biased at a positive potential. The walls are biased substantially at ground potential. Instead of just measuring the target current in the Faraday Cage, the present apparatus has means connected to both the target and the wall so that both the target current and the wall current may be measured and combined to provide an accurate measurement of the beam current.

With such an arrangement, the secondary particles created by ion collision with the target and other portions of the Faraday Cage, e.g., in the case of a positive ion beam, such secondary particles would be for the most part electrons, are repelled toward the walls of the Faraday Cage where they are measured as part of the wall current while the ions are measured as the target current. Likewise, a small number of secondary positive ions produced at the target will be attracted to the target and measured as part of the target current. Because of this biasing condition, there will be no undesirable expansion of the ion beam from its precise selected dimensions since the biasing condition will not affect the beam neutralization as will be explained hereinafter.

It is also important that the walls be maintained at ground potential. In this manner, the walls may be considered to be at opposite potential to the target with respect to the beam. On the other hand, as will be explained hereinafter in the specification in greater detail, the primary particle beam has a floating cloud of secondary particles of opposite charge produced during the operation of the bombardment apparatus intermixed with and surrounding the primary beam. These secondary charge particles, which in the case of the positive primary ion beam bombardment apparatus would be secondary electrons, act to neutralize the field created by the positive ions. If the walls were at a positive potential instead of ground, the secondary electron cloud would be stripped away and the positive ions in the primary beam would repel each other to some extend and would cause undesirable beam diameter expansion, particularly in the case of high current ion beams.

A similar effect would be expected to take place where the primary beam was an electron beam, the secondary beam a positive ion cloud and the Faraday Cage walls ere biased at a negative potential instead of the ground potential as required by the structure of the present invention.

In accordance with a more particular aspect of the present invention, it has been found that in order to ensure that all of the secondary particles approaching Faraday Cage walls are measured as part of the wall current, the Faraday Cage at the target should have such dimensions that the length of the Faraday Cage along the beam axis is at least nine times the diameter of the opening at the entrance to the Faraday Cage along the beam diameter opposite to the target. On the other hand, in accordance with a specific structure of the present invention, the apparatus further includes means for providing a fixed magnetic field within the Faraday Cage perpendicular to the beam. In such a case, the length of the Faraday Cage may be markedly reduced to dimensions wherein the length is only at least 1.5 times the diameter of the opening into the Faraday Cage.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 1 discloses a schematic representation of an ion implantation apparatus in order to illustrate the operative association of the current measuring structure of the present invention with overall ion implantation apparatus.

FIG. 2 and 2A is a partial diagrammatic sectional view of an ion beam current measuring apparatus in accordance with the present invention.

FIG. 3 is a partial sectional view of an alternative embodiment of the current measuring apparatus of the present invention.

FIG. 4 is a fragmentary sectional view of another embodiment under the broad concept of the present invention.

DESCRIPTION OF PREFERRED EMBODIMENTS

Referring now to the drawings and initially to FIG. 1, the beam current measuring apparatus of the present invention will be described with respect to ion implantation apparatus. However, it should be understood that the principles of the present invention are equally applicable to electron beam apparatus for the purpose of beam measurement, and one skilled in the art should be readily able to apply the principles of the present invention to the measurement of electron beam current. In FIG. 1, the Faraday Cage measurement apparatus 10 is shown as it is related to a conventional ion implantation or bombardment apparatus. It should be recognized that the apparatus in FIG. 1 is schematic in nature and represents conventional ion implantation apparatus such as that described in U.S. Pat. No. 3,756,862. The apparatus in FIG. 1 includes a conventional ion source 12 which may be any suitable high density source, although in the embodiments illustrated a hot filament electron impact source is shown, adapted to be operated in an oscillating electron discharge mode. An ion beam is extracted from the source in the conventional manner through extraction electrode 16 via aperature 15. Electrode 16 which is also known as an accel-electrode is maintained at a negative potential by the decel supply illustrated to extract ions from the source, the source electrode 17 being maintained at a positive potential by the anode supply. A decel-electrode 18 is also provided, adapted to be maintained at ground potential. It should be recognized that the bias voltages described may be varied in the operation of the device by those skilled in the art.

The beam extracted from the ion source by the electrode arrangment disclosed is transmitted along a beam path generally indicated at 19 to an analyzing magnet 20 of conventional design. The beam is further defined in the conventional manner by apertured plates 21 and 22 located on either side of the analyzing magnet, and the beam is focused upon a target 23 within the limits of Faraday Cage 10. A mass defining aperture plate 24 is included in the apparatus as illustrated.

With reference to FIG. 2, Faraday Cage 10 is shown in greater detail. The Faraday Cage is made up of target 23 which comprises in this case a semiconductor wafer holder 24 supporting a plurality of wafers 25. The wafer holder is rotated and oscillated in the direction indicated by a standard deflection apparatus such as that described in U.S. Pat. No. 3,778,626 in order to ensure uniform distribution of the ion beam 20 across the surfaces of all of the wafers 25 mounted on the target support 24. Alternatively, of course, the Faraday Cage arrangement of the present invention may function with a stationary target 23. The Faraday Cage including the target is enclosed in any suitable conventional chamber (not shown) for maintaining a high vacuum in the ion implantation apparatus. Faraday Cage wall 26 must be electrically insulated from target 23. In the present embodiment, it is shown spaced from target 23. Faraday Cage wall 26 is biased at ground potential through connector 27, and since for the purposes of the present embodiment an ion beam is being used with, of course, positively charged ions in the primary beam, the target is biased at a negative potential level by connector 28. In measuring the total beam current, both the target current flowing along connector 28 and the wall current flowing along connector 27 are measured by appropriate measuring devices, e.g., ammeters 29 and 30, and the readings combined to produce the total current. Alternatively, connectors 28A and 27A may be connected into a single line 45 at the ground side of negative voltage bias supply 31A and a single current reading taken along this line or the current may be fed into the current integrator to monitor the implantation dose, as shown in FIG. 2A.

The following are typical operating parameters. When utilizing apparatus operating at an energy level in the order of 50 keV with ions such as argon or arsenic and beam currents in the order of one milliampere or higher, best results are achieved by negative bias voltage on the target of at least -15 volts. With the structure shown, any secondary particles created by ion collision with the target or with other portions of the Faraday Cage, will primarily be secondary electrons which would be repelled toward the walls of the Faraday Cage where they would be measured as part of the wall current. Similarly, a small number of secondary positive ions would be produced at the target by collisions with the target by the ions in the primary beam. Such secondary positive ions would be attracted to the target and measured along with primary ions as part of target current.

Because the walls 26 are at ground potential, they are in effect biased at a potential opposite to that of the target. On the other hand, there would be no effect on the floating cloud of secondary electrons found intermixed with any conventional positive ion beam. These secondary electrons produced during the bombardment of the apparatus act to neutralize the field created by the positive ions in the primary beam, and are desirably left in place. However, if walls 26 were at a positive potential instead of ground, this secondary electron cloud would be stripped away, and the positive ions in the ion beam would repel each other to some extend and would cause undesirable beam diameter expansion, particularly in the case of high current ion beams.

It should be noted here that in monitoring or measuring a conventional electron beam by the structure of the present invention, a similar effect will take place. In measuring the electron beam, the target will be positively biased since the primary particles will be negative particles. The walls would still remain at ground potential. In this manner, secondary ions produced by collisions will be repelled by the target toward the wall at ground potential and will become part of the wall current. On the other hand, the secondary electrons produced at the target will become part of the target current. In order for the Faraday Cage, shown in FIG. 2, to function most effectively, the length of the Faraday Cage, i.e., the distance from entry opening 32 in the wall of the Faraday Cage to the target must be at least nine times the diameter of opening 32.

However, as shown in FIG. 3, the Faraday Cage may be substantially shortened by an apparatus modification wherein a fixed or D.C. magnetic filed is applied perpendicular to the beam axis. In FIG. 3, the target 33, the walls 34 and the connectors 35 and 36 to these walls are similar in structure to the apparatus described in FIG. 2. The biasing is similar. However, magnet 37 creates a magnetic field perpendicular to the beam axis having a magnetic strength in the order of 30 Gauss would be sufficient so that the length of the Faraday Cage could be shortened to 1.5 times the diameter of opening 38 along the beam axis. We have further found that the magnetic field can still function effectively even when its direction varies up to 30° from the perpendicular to the beam axis.

It should be recognized that in automated ion implantation equipment operating under high vacuum, it is important that the target chamber be as short as possible in order to minimize pump-down times to achieve high vacuum after a loading of workpieces. Thus, the advantage of having a Faraday Cage length as short as possible is evident. Where the Faraday Cage is relatively short, i.e., the length is in the order of 1.5 times the diameter of the opening to the Faraday Cage, it may be advantageous to use a wedge or horn-shaped Faraday Cage of the type shown in FIG. 4. Since the target and the electrical biasing to the target and the cage walls are substantially similar to those previously described, we will omit the detail here. The angle of the wedge or horn-shaped walls 41 shown in FIG. 4 with respect to the beam axis must be such that it is larger than any potential beam divergence angle within the cage. In this manner, the primary beam will not be collected by the walls of the cage, and will become only part of the target current. On the other hand, the wider end of the cage walls 41 must be sufficiently wide to capture substantially all of the secondary electrons produced at the target.

While the invention has been particularly shown and described with reference to the preferred embodiments thereof, it will be understood by those skilled in the art that various changes in form and details may be made therein without departing from the spirit and scope of the invention.

What is claimed is:

1. In apparatus for bombarding a target with a beam of charged particles, a structure for measuring the beam current at said target; comprising:
    walls adjacent to and electrically insulated from said target and surrounding said beam whereby said walls and target provide a Faraday Cage,
    means for biasing said target at a potential opposite the polarity of the primary particles in said beam,
    means for biasing said walls at substantially ground potential,
    means connected to said target for measuring said target current, and
    means connected to said wall for measuring the wall current.

2. The apparatus of claim 1, further including means for combining the target current and wall current to provide said beam current measurement.

3. The apparatus of claim 2 wherein said primary particles in said beam are positively charged ions, and said target is biased at a negative potential.

4. The apparatus of claim 1 wherein said primary particles in said beam are electrons, and said target is biased at a positive potential.

5. In apparatus for bombarding a target with a beam of charged particles, a structure for measuring the beam current at said target comprising:
    walls adjacent to and electrically insulated from said target and surrounding said beam whereby said walls and target provide a Faraday Cage, and
    means for conbining and measuring said target and wall currents to provide said beam current measurement.

6. The apparatus of claim 5 wherein said primary particles in said beam are positively charged ions, and said target is biased at a negative potential.

7. The apparatus of claim 5 wherein said primary particles in said beam are electrons; and said target is biased at a positive potential.

8. The apparatus of claim 2 wherein the walls of the Faraday Cage further define an opening along the beam axis opposite to the target through which the beam enters the Faraday Cage, and
    the Faraday Cage has dimensions wherein the length of the Faraday Cage along the beam axis is at least nine times the diameter of said opening.

9. The apparatus of claim 8 wherein said primary particles in said beam are positively charged ions, and said target is biased at a negative potential.

10. The apparatus of claim 8 wherein said primary particles in said beam are electrons, and said target is biased at a positive potential.

11. The apparatus of claim 2 wherein the walls of the Faraday Cage further define an opening along the beam axis opposite to the target through which the beam enters the Faraday Cage, and
    the apparatus further includes means for providing a fixed magnetic field within said Faraday Cage perpendicular to said beam, and
    the length of said Faraday Cage is at least 1.5 times the diameter of said opening.

12. The apparatus of claim 11 wherein said primary particles in said beam are positively charged ions, and said target is biased at a negative potential.

13. The apparatus of claim 11 wherein said primary particles in said beam are electrons, and said target is biased at a positive potential.

14. In the method of measuring the beam current of a beam of charged particles bombarding a target by a Faraday Cage formed by said target and the walls surrounding the beam the steps of electrically insulating said target from said walls, biasing said target at a potential opposite the polarity of the primary particles in said beam, biasing said walls at substantially ground potential, and combining and measuring both said target and wall currents.

15. The method of claim 14 wherein said primary particles in said beam are positively charged ions, and said target is biased at a negative potential.

16. The method of claim 14 wherein said primary particles in said beam are electrons; and said target is biased at a positive potential.

17. The method of claim 14 wherein a fixed magnetic field is applied within said Faraday Cage perpendicular to said beam.

18. The method of claim 17 wherein said primary particles in said beam are positively charged ions, and said target is biased at a negative potential.

* * * * *